United States Patent
Lee et al.

[11] Patent Number: 5,920,214
[45] Date of Patent: Jul. 6, 1999

[54] METHOD AND APPARATUS FOR GENERATING AN EIGHT-TO-FOURTEEN MODULATION DATA RESTORING CLOCK SIGNAL

[75] Inventors: Jae-Shin Lee; Dong-myung Choi, both of Kyungki-do, Rep. of Korea

[73] Assignee: Samsung Electronics, Co., Ltd., Suwon, Rep. of Korea

[21] Appl. No.: 08/815,416

[22] Filed: Mar. 11, 1997

[30] Foreign Application Priority Data

Mar. 30, 1996 [KR]  Rep. of Korea .................. 96/9580

[51] Int. Cl.$^6$ ........................................ H03L 7/06
[52] U.S. Cl. .................... 327/147; 327/150; 327/151; 327/156
[58] Field of Search ............................ 327/147, 150–151, 327/156

[56] References Cited

U.S. PATENT DOCUMENTS

| | | | |
|---|---|---|---|
| 5,594,763 | 1/1997 | Nimishakavi | 327/156 |
| 5,661,425 | 8/1997 | Minoda et al. | 327/156 |
| 5,818,265 | 10/1998 | Meller et al. | 327/150 |

*Primary Examiner*—Margaret R. Wambach
*Attorney, Agent, or Firm*—Marger Johnson & McCollom, P.C.

[57] ABSTRACT

A method and phase locked loop for generating an eight-to-fourteen (EFM) data restoring clock signal. A frequency detector detects the number of clock pulses input during a pulse width of the EFM data signal, compares the detected number with predetermined maximum and minimum values, and outputs a signal indicative of the resulting comparison value. A voltage controlled oscillator varies an oscillating frequency in response to a DC control signal and outputs the clock pulses corresponding to the oscillating frequency. A programmable counter frequency-divides the clock pulses generated by the voltage controlled oscillator in response to a predetermined speed multiple and outputs the frequency-divided clock pulses. A phase detector detects a phase difference between the EFM data signal and the clock pulses generated by the programmable counter and outputs a signal indicative of the phase difference. A mixer mixes the output of the phase detector with the output of the frequency detector. A control signal generator outputs the DC control signal according to the output of the mixer. Thus, the data access speed is increased and the phase locked loop is more rapidly set into a locking range.

17 Claims, 4 Drawing Sheets

METHOD AND APPARATUS FOR GENERATING AN EIGHT-TO-FOURTEEN MODULATION DATA RESTORING CLOCK SIGNAL

BACKGROUND OF THE INVENTION

The present invention relates generally to the recordation and reproduction of eight-to-fourteen modulation (EFM) data, and more particularly, to a phase locked loop (PLL) and method for generating an EFM data restoring clock signal.

Variable speed playback systems can be used to play pre-recorded data independent of their spindle motor speed, although such systems ordinarily encounter difficulties in properly reproducing EFM data recorded at a speed set by a fixed clock signal. A restoring clock signal, such as generated by a PLL, is needed to properly reproduce the EFM data.

Conventional PLLs are limited to phase detection in a capture range of +10 to −10 clock pulses. Some types of playback systems which have four or more multiple speeds, such as CD-ROM players or digital video disk players, need PLLs capable of a wider capture range to gain access to EFM data that has been recorded at a higher speed.

As described further with reference to FIG. 1, prior art PLLs suffer from several problems. One form of conventional PLL has a wide capture range that can detect some pre-set maximum number of clock pulses ($T_{max}$) occurring between a rising edge and a falling edge of a reproduced EFM data signal. This type of PLL can measure the detected number of clock pulses against a reference clock cycle to control a generated clock signal frequency. This process, however, is slow and requires a considerable amount of time to vary the generated clock signal frequency.

A variation on this form of conventional PLL varies the clock signal frequency by selecting from among several detected $T_{max}$ values. This approach is also slow and requires a considerable amount of time to generate a restoring clock signal, thereby leading to delays often comparable to the delay incurred by a disk access operation.

A further problem with conventional PLLs is that they typically require a considerable amount of time to be configured into a locking range.

SUMMARY OF THE INVENTION

It is, therefore, an object of the present invention to provide a method for generating a clock signal using a PLL having a wide capture range to thereby reduce data access time.

It is a further object of the present invention to provide a PLL having a wide capture range for generating a clock signal for use in restoring EFM data.

The invention is a method for generating an EFM data restoring clock signal. A rising edge and a falling edge of an EFM data signal are detected. The number of clock pulses occurring between the rising edge and falling edge is counted. The counted value is compared to a permissible minimum number and maximum number of clock pulses occurring between the rising edge and the falling edge. The frequency of the clock signal is increased if the counted value is smaller than the permissible minimum value. The frequency of the clock signal is decreased if the counted value is larger than the permissible maximum value. Phases of the clock pulses are synchronized if the counted value falls between the permissible minimum value and the permissible maximum value.

The invention is also a phase locked loop (PLL) for generating a clock signal for use in restoring EFM reproduced from a disk. A frequency detector is provided for detecting the number of clock pulses input during a pulse width of an EFM data signal, comparing the detected number of clock pulses with predetermined maximum and minimum values and outputting a signal indicative of the resulting comparison value. A voltage controlled oscillator is provided for varying an oscillating frequency in response to a direct current (DC) control signal and outputting a clock pulse corresponding to the oscillating frequency. A program counter is provided for frequency dividing the clock pulse generated by the voltage controlled oscillator in response to a predetermined speed and outputting the frequency divided clock pulses. A phase detector is provided for detecting a phase difference between the EFM data signal and the clock pulses generated by the programmable counter and outputting a signal indicative of the phase difference. A mixer is provided for mixing the output of the phase detector with the output of the frequency detector. A control signal generator is provided for outputting the DC control signal according to the output of the mixer.

The foregoing and other objects, features and advantages of the invention will become more readily apparent from the following detailed description of a preferred embodiment of the invention which proceeds with reference to the accompanying drawings.

DETAILED DESCRIPTION OF THE INVENTION

Figure 1:
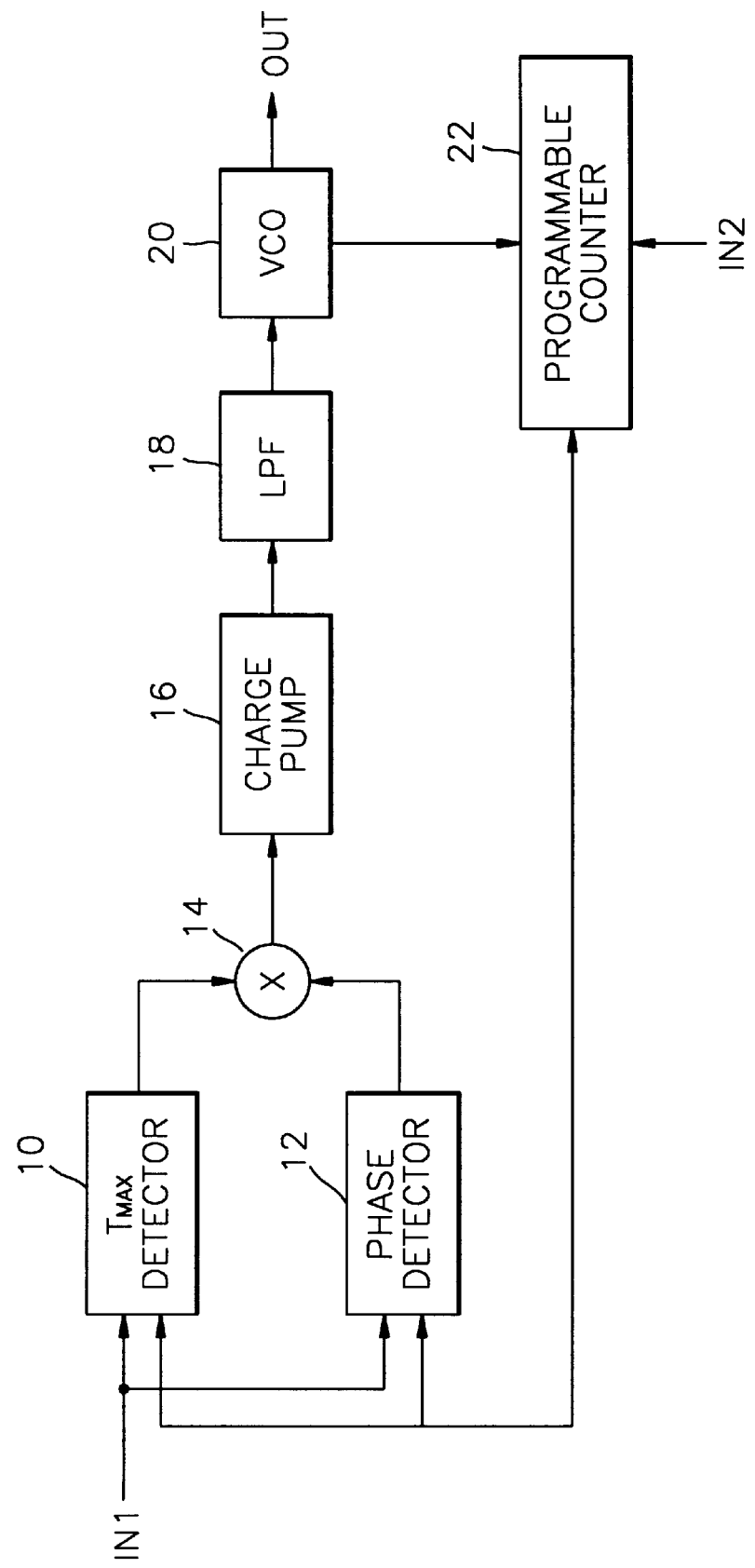
FIG. 1 is a block diagram of a prior art conventional PLL having a wide capture range.

Referring to FIG. 1, a prior art conventional PLL having a wide capture range is shown. A phase detector 12 detects a phase difference between EFM data received through an input terminal INI and a clock signal received from a programmable counter 22, and outputs a signal indicative of the phase difference to a charge pump 16 through a mixer 14.

The charge pump 16 charges or discharges an output to low pass filter (LPF) 18 according to the signal received from the mixer 14. A voltage controlled oscillator (VCO) 20 outputs a clock signal having a variable frequency to the programmable counter 22 in response to a direct current (DC) signal generated by the LPF 18. The programmable counter 22 frequency-divides the clock signal generated by the VCO 20 in response to a signal corresponding to a multiple speed, that is, the transmission speed of the data, received through an input terminal IN2 and outputs the frequency-divided clock signal to the phase detector 12 and a $T_{max}$ detector 10.

The $T_{max}$ detector 10 detects the rising edge and the falling edge of a reproduced EFM data signal received through the input terminal IN1, detects the number of clock pulses generated by the programmable counter 22 between the rising edge and the falling edge, and determines a maximum number of detected clock pulses, referred to as $T_{max}$. In addition, the $T_{max}$ detector 10 compares the $T_{max}$ value to $T_{11}$, where $T_{11}$ indicates eleven clock cycles. If the $T_{max}$ is larger than $T_{11}$, the $T_{max}$ detector 10 outputs a signal for reducing the frequency of the clock signal to the charge pump 16 via the mixer 14. If the $T_{max}$ is smaller than $T_{11}$, the $T_{max}$ detector 10 outputs a signal for increasing the frequency of the clock signal to the charge pump 16 via the mixer 14. If the $T_{max}$ equals $T_{11}$, the $T_{max}$ detector 10 does not output a signal to the mixer 14 and the mixer 14 consequently receives only the signal output from the phase detector 12. When phase synchronization is achieved by the phase detector 12, the VCO 20 outputs a predetermined restoring clock signal to an EFM data restoring unit (not shown) through the output terminal OUT.

The conventional PLL of FIG. 1 must detect one $T_{max}$ in 128 edge sections, compare the $T_{max}$ to $T_{11}$, and control the clock signal frequency of the VCO 20. This often requires an unacceptable amount of time for varying the clock signal frequency.

Figure 2:
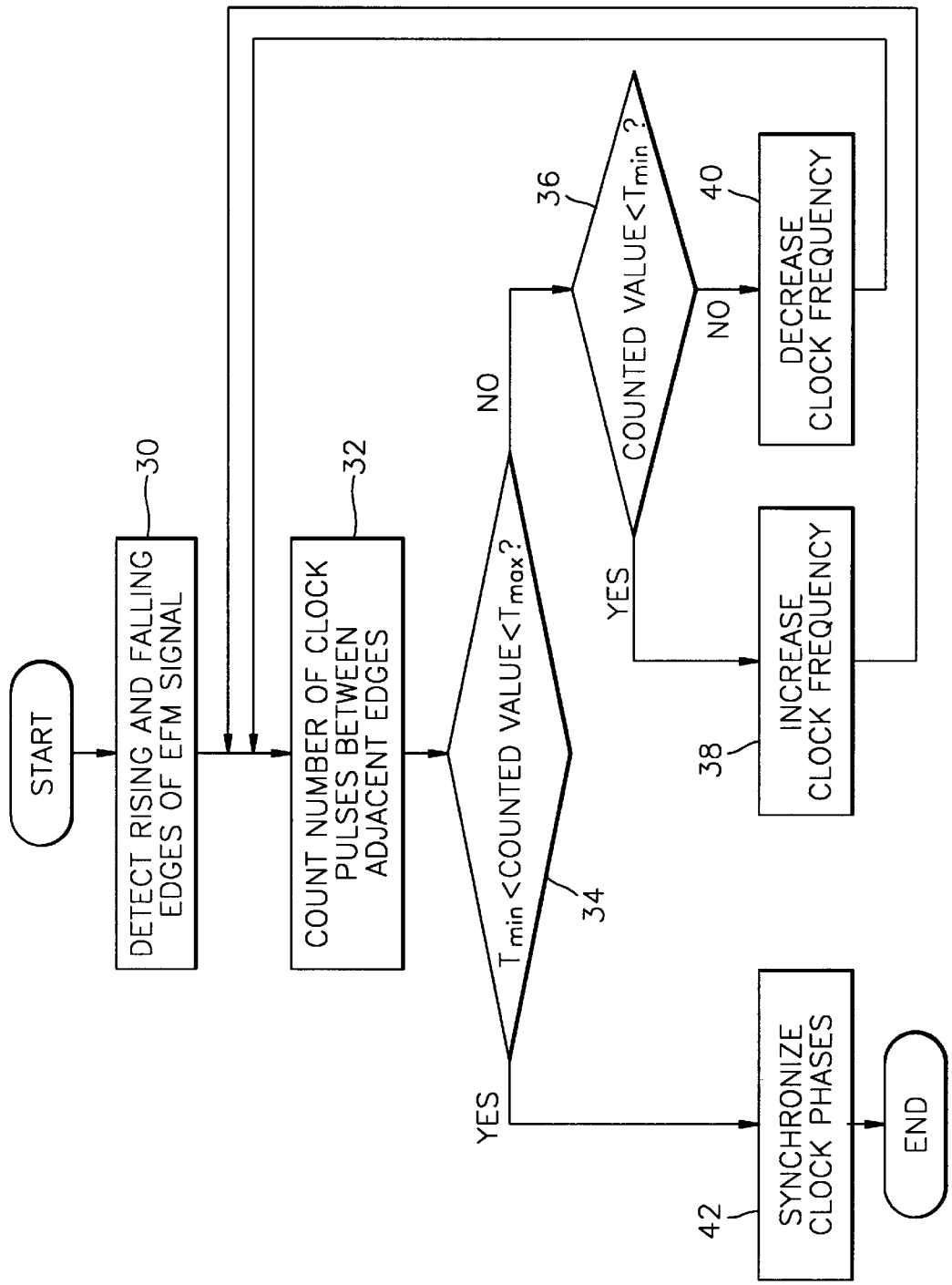
FIG. 2 is a flowchart of a method for generating an EFM data restoring clock signal according to the present invention.

Referring to FIG. 2, a flow chart for a method for generating a clock signal using a PLL in accordance with the present invention is shown. As an overview, the method consists primarily of two main operations. During steps 30–36, the number of clock pulses received during one pulse width of an EFM data signal is determined. During steps 38–42, the frequency of the clock pulses is varied according to the number of clock pulses received. The individual steps of the method shown in FIG. 2 will be further described herein below following the discussions of FIGS. 3, 4A and 4B.

Figure 3:
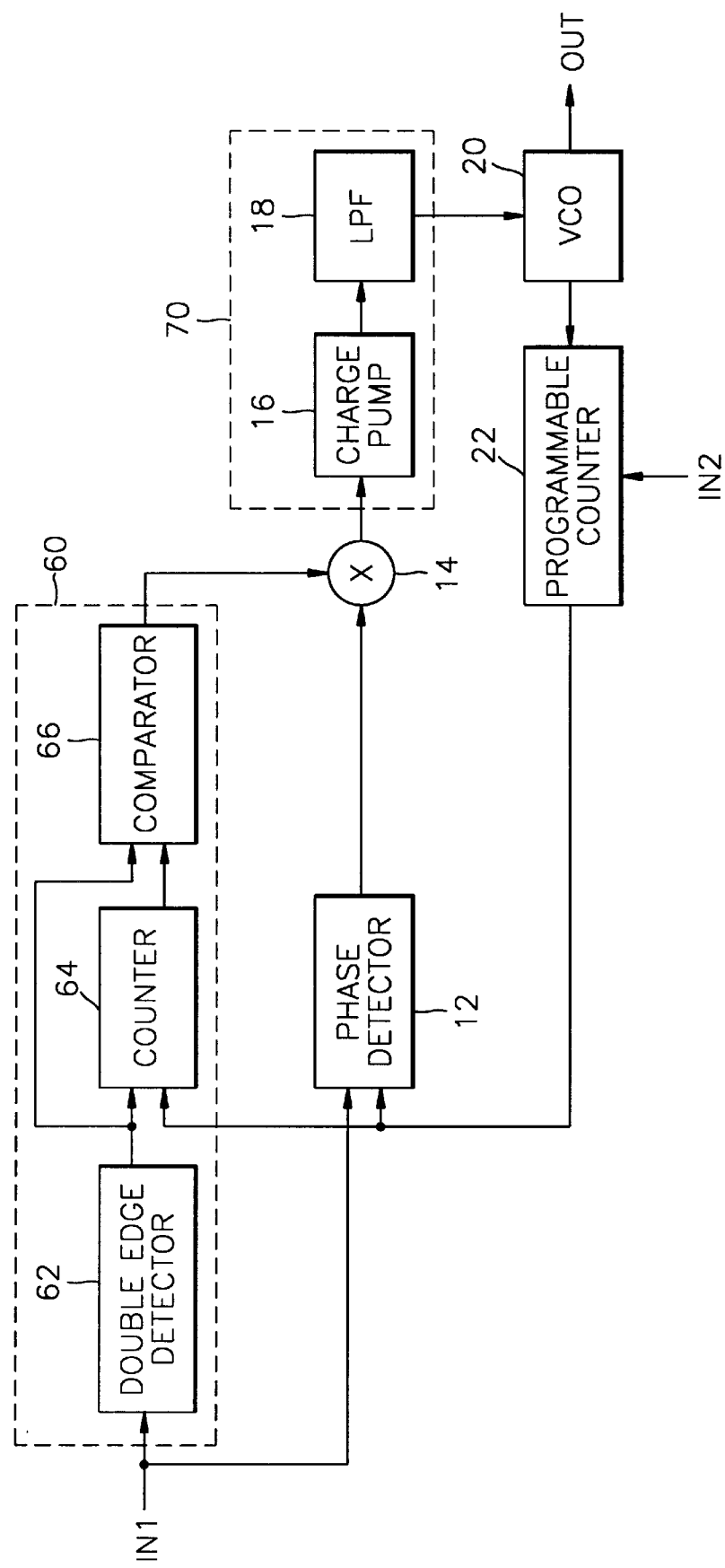
FIG. 3 is a block diagram of a PLL for generating an EFM data restoration clock signal constructed in accordance with the present invention.

Referring to FIG. 3, a phase locked loop (PLL) constructed in accordance with the present invention is shown. A frequency detecting portion 60 determines the number of clock pulses received during the pulse width of an EFM data signal received through an input terminal IN1. The frequency detecting portion 60 compares the number of received clock pulses to a pair of predetermined maximum and minimum values and outputs a signal indicative of the comparison. The maximum and minimum values define a range of permissible values. A voltage controlled oscillator (VCO) 20 varies an output frequency in response to a direct current (DC) control signal and outputs a clock signal corresponding to the varied frequency through an output terminal OUT. A programmable counter 22 divides the frequency of the clock signal received from the VCO 20 according to a predetermined multiple of a disk speed input through an input terminal IN2 and outputs a frequency-divided clock signal. A phase detector 12 detects a phase difference between the received EFM data signal and the clock signal output from the programmable counter 22 and outputs a signal indicative of the phase difference. A mixer 14 mixes the outputs of the phase detector 12 and the frequency detecting portion 60. A control signal generating portion 70, consisting of a charge pump 16 and a low pass filter (LPF) 18, outputs a DC control signal according to the output of the mixer 14.

Figures 4A, 4B:
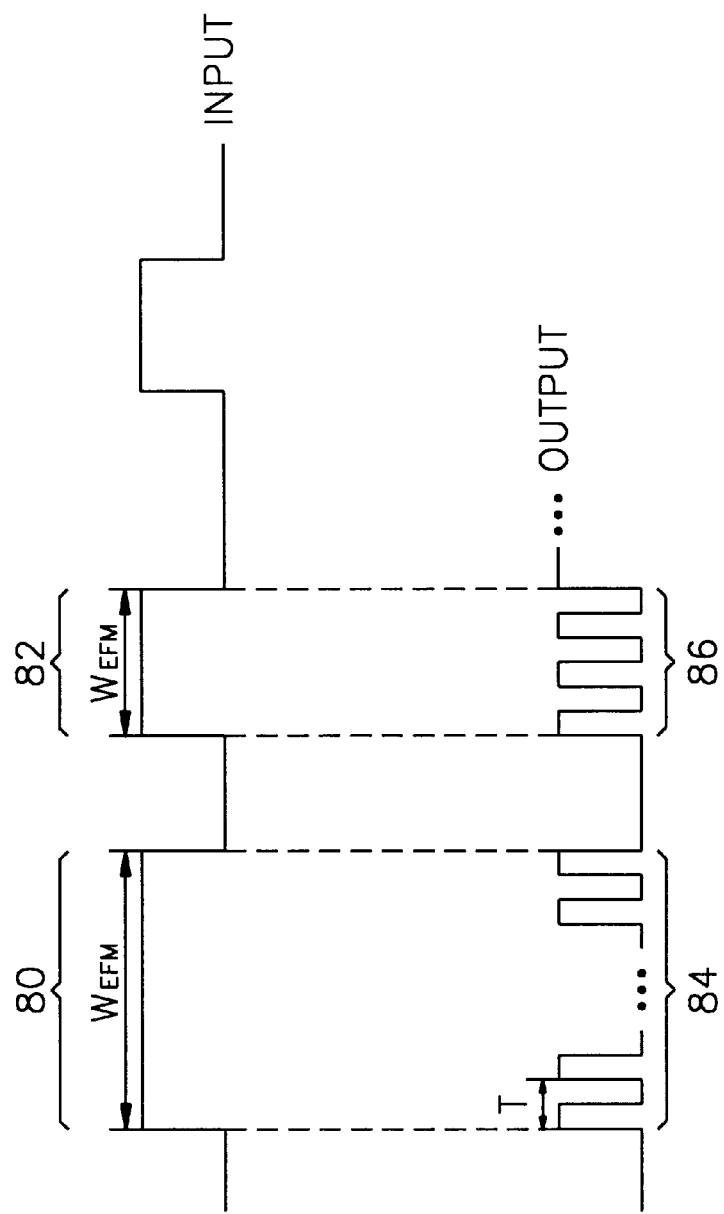
FIGS. 4A and 4B are timing diagrams of signals input to and output from the PLL of FIG. 3, respectively.

Referring to FIGS. 4A and 4B, timing diagrams of input and output signals, respectively, of the PLL (shown in FIG. 3) are shown. FIG. 4A is a timing diagram of an EFM data signal received through the input terminal INI of the frequency detecting portion 60 (shown in FIG. 3). Referring first to FIG. 4A, a timing diagram of an EFM data signal received through the input terminal IN1 is shown. Reference numerals 80 and 82 respectively show larger and smaller widths of an input EFM data signal $W_{EFM}$. Referring next to FIG. 4B, a timing diagram of the clock signal output from the output terminal OUT of the VCO 20 (shown in FIG. 3) is shown. Reference numerals 84 and 86 respectively denote eleven clock pulses and three clock pulses. The PLL of the present invention (shown in FIG. 3) restricts the number of successive zero or ones of EFM data to a range of 3 through 11 clock pulses for generating the restoring clock signal. Since the reproduced EFM data contains information relating to the restoring clock signal, the PLL generates a restoring clock signal from detected edges of the EFM data signal.

Referring again to FIG. 3, the frequency detecting portion 60 has a double edge detector 62 for detecting the rising edge and the falling edge of the EFM data signal received via the input terminal IN1. A counter 64 counts the number of clock pulses output from the programmable counter 22 between the rising edge and the falling edge of the EFM data signal. A comparator 66 receives the rising edge and the falling edge and compares the number of edges with maximum and minimum values to determine whether the counted value is larger than the maximum value or smaller than the minimum value. The comparator 66 outputs a signal indicative of the comparison.

The programmable counter 22 receives the clock signal output from the VCO 20 and frequency divides the clock signal in response to a multiple of the rotational speed of the disk received through an input terminal IN2. The programmable counter 22 outputs the frequency-divided clock signal to the phase detector 12 and the counter 64. The magnitude of the frequency-divided clock signal is inversely proportionate to the rotation speed of the disk. The faster the speed, the smaller the frequency division ratio.

When the PLL is set in a locking range, a synchronizing clock signal is output to an EFM data restoring portion (not shown) as described below.

Referring back to FIG. 2, the individual steps comprising the method for generating an EFM data restoring clock signal in accordance with the present invention will now be described. In step 30, the double edge detector 62 detects a rising edge and a falling edge of the EFM data received from the input terminal IN1 and outputs a signal representing the detected edges to the counter 64 and the comparator 66. In step 32, the counter 64 counts the number of clock pulses output from the programmable counter 22 between adjacent edges of the received EFM data signal and outputs the counted value to the comparator 66. In step 34, the comparator 66 compares the counted value to the minimum and maximum values (shown as $T_{min}$ 86 and $T_{max}$ 84 in FIG. 4B, respectively) of clock pulses permissible during the width of the received EFM data signal (shown as $W_{EFM}$ 82 and $W_{EFM}$ 80 in FIG. 4A, respectively) for respectively determining whether $T_{min}$ is less than the counted value and if $T_{max}$ is greater than the counted value. In the described embodiment, $T_{min}$ is 3 and $T_{max}$ is 11, although other values are equally acceptable.

In step 36, if the counted value is smaller than $T_{max}$ or larger than $T_{min}$, the counted value is compared to $T_{min}$. In step 40, if the counted value is larger than $T_{min}$, the clock signal frequency output from the VCO 20 is decreased. If there are 11 or more clock pulses occurring within the width of the EFM data signal $W_{EFM}$, the frequency of the clock signal is too large and the mixer 14 mixes the signal from the comparator 66 with the signal corresponding to the phase difference output from the phase detector 12 and the charge pump 16 discharges an electric charge. Accordingly, the LPF 18 outputs a deceleration DC control signal to the VCO 20 for decreasing the frequency of the oscillated clock signal responsive to the decelerated DC control signal.

However, in step 36, if the counted value is smaller than $T_{min}$, the clock signal frequency output from the VCO 20 is increased to permit three or more clock pulses during the smaller width of the EFM data signal $W_{EFM}$. The comparator 66 outputs a signal to the mixer 14 for increasing the frequency and the mixer 14 mixes the signal output from the comparator 66 with a signal output from the phase detector 12 indicative of a phase difference. The charge pump 16 then fills charges according to the output of the mixer 14. Next, the LPF 18 outputs an accelerating DC control signal to the VCO 20 responsive to the charges filled by the charge pump 16 to thereby increase the oscillated clock signal frequency responsive to the accelerating DC control signal.

In step 42, if $T_{min}$ is less than the counted value and $T_{max}$ is greater than the counted value, the frequency detecting portion 60 outputs no signal and the PLL is controlled only by the phase detector 12 thereby performing phase synchronization. The phase detector 12 detects a phase difference between the EFM data signal received through the input terminal IN1 and the divided clock signal output from the programmable counter 22 and outputs a signal indicative of the phase difference to the charge pump 16 though the mixer 14.

In the present clock signal generating method, the clock signal frequency is varied by comparing the number of clock pulses received during the width of the EFM data signal with pre-set maximum and minimum values. Thus, the clock signal is generated in a shorter time period than that generated by the prior art conventional PLL described with reference to FIG. 1. Moreover, when the disk is at a halt or an optical pickup jumps out of order, the clock signal frequency of the VCO 20 is controlled in a frequency locking range according to the disparity between the pickup and the speed of the spindle motor. Thus, the PLL is rapidly set to a locking range.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A method for generating an eight-to-fourteen modulation (EFM) data restoring clock signal, comprising the steps of:
    detecting a rising edge and a falling edge of an EFM data signal;
    counting the number of clock pulses occurring between the rising edge and the falling edge of the EFM data signal;
    determining whether the counted number of clock pulses falls within a range of permissible numbers of clock pulses;
    increasing the frequency of the clock signal if the counted number of clock pulses falls below the range of permissible numbers of clock pulses; and
    decreasing the frequency of the clock signal if the counted number of clock pulses falls above the range of permissible numbers of clock pulses.

2. A method according to claim 1, further comprising the step of defining the range of permissible numbers of clock pulses bounded by a minimum number and a maximum number of clock pulses.

3. A method according to claim 2, wherein the step of determining whether the counted number of clock pulses falls within the range of permissible numbers of clock pulses further comprises the steps of:
    comparing the counted number of clock pulses to the minimum number of clock pulses; and
    comparing the counted number of clock pulses to the maximum number of clock pulses.

4. A method according to claim 2, further comprising the step of:
    synchronizing phases of the clock pulses if the counted number of clock pulses is not less than the minimum number of clock pulses and not more than the maximum number of clock pulses.

5. A method according to claim 2, wherein the minimum number of clock pulses equals 3 clock pulses and the maximum number of clock pulses equals 11 clock pulses, the step of determining further comprising comparing the counted number of clock pulses to 3 clock pulses and 11 clock pulses.

6. A phase locked loop for generating a clock signal for use in restoring an eight-to-fourteen modulation (EFM) data signal reproduced from a disk, comprising:
    a frequency detector operable to detect the number of clock pulses input during a pulse width of the EFM data signal to, compare the detected number of clock pulses to predetermined maximum and minimum numbers of clock pulses, and to generate a frequency-detector signal indicative of the resulting comparison value;
    a voltage controlled oscillator having an oscillating frequency which varies in response to a DC control signal, said oscillator generating clock pulses corresponding to the oscillating frequency;
    a programmable counter operable to frequency-divide the clock pulses generated by the voltage controlled oscillator in response to a predetermined speed multiple, said programmable counter applying the frequency-divided clock pulses to an output terminal thereof;
    a phase detector operable to detect a phase difference between the EFM data signal and the clock pulses on the programmable counter output terminal and generating a phase detection signal indicative of the phase difference;
    a mixer operably connected to the phase detector and the frequency detector, said mixer mixing the phase detection signal and the frequency-detector signal; and
    a control signal generator operable to generate the DC control signal according to the output of the mixer.

7. A phase locked loop as claimed in claim 6, wherein the frequency detector comprises a double edge detector operably connected to an input terminal, said double edge detector detecting a rising edge and a falling edge of the EFM data signal on the input terminal and generating a edge detected signal.

8. A phase locked loop as claimed in claim 7, wherein the frequency detector further comprises a counter operably connected to the programmable counter and the double edge detector, said counter counting the number of clock pulses generated by the programmable counter between the rising edge and the falling edge of the EFM data signal as a counted value.

9. A phase locked loop as claimed in claim 8, wherein the frequency detector further comprises a comparator operably connected to the double edge detector and the counter, said comparator comparing the counted value of the counter with the maximum and minimum numbers of clock pulses to determine whether the counted value is larger than the maximum number or smaller than the minimum number in response to the edge detected signal of the double edge detector and outputting the frequency-detected signal.

10. A phase locked loop as claimed in claim 6, wherein the control signal generator further comprises a charge pump operably connected to the mixer, said control signal generator generating an output charge in response to the output of the mixer.

11. A phase locked loop as claimed in claim 10, wherein the control signal generator further comprises a low pass filter operably connected to the control signal generator, said low pass filter generating the DC control signal in response to the output charge of the control signal generator.

12. A phase locked loop for eight-to-fourteen modulation (EFM) data signal reproduction, comprising:

means for detecting a pulse width of the EFM data signal received on an input terminal, the pulse width detecting means generating a frequency-detected signal indicative of a number of detected clock pulses versus predetermined maximum and minimum numbers of clock pulses;

means for oscillating a frequency in response to a DC control signal on an output terminal, said oscillating means further generating clock pulses corresponding to the oscillating frequency;

means for counting the clock pulses generated by the oscillating means in response to a predetermined speed multiple received on a further input terminal;

means for detecting a phase difference between the EFM data signal and the clock pulses received from the oscillating means, the phase difference detecting means generating a phase detection signal indicative of the phase difference;

means for mixing the phase detection signal and the frequency-detected signal; and means for generating the DC control signal according to the output of the mixing means.

13. A phase locked loop as claimed in claim 12, wherein the means for detecting a pulse width comprises means for detecting a rising edge and a falling edge of the EFM data signal on the input terminal and generating a edge detected signal.

14. A phase locked loop as claimed in claim 13, wherein the means for detecting a pulse width further comprises means for counting the number of clock pulses generated by the clock pulse counting means between the rising edge and the falling edge of the EFM data signal.

15. A phase locked loop as claimed in claim 14, wherein the means for detecting a pulse width further comprises means for comparing the counted number of clock pulses with the maximum and minimum numbers of clock pulses to determine whether the counted number of clock pulses is larger than the maximum number or smaller than the minimum number in response to the edge detected signal, the means for detecting a pulse width outputting the frequency-detected signal.

16. A phase locked loop as claimed in claim 12, wherein the DC control signal generating means further comprises means for generating an output charge in response to the output of the mixing means.

17. A phase locked loop as claimed in claim 16, wherein the DC control signal generating means further comprises means for generating the DC control signal in response to the output charge of the control signal generator.

* * * * *